(12) United States Patent
Kim

(10) Patent No.: US 7,727,844 B2
(45) Date of Patent: Jun. 1, 2010

(54) GATE STRUCTURE OF A SEMICONDUCTOR DEVICE

(75) Inventor: Dae Kyeun Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 100 days.

(21) Appl. No.: 11/616,278

(22) Filed: Dec. 26, 2006

(65) Prior Publication Data

US 2007/0158761 A1    Jul. 12, 2007

(30) Foreign Application Priority Data

Dec. 29, 2005   (KR) .................... 10-2005-0134167

(51) Int. Cl.
*H01L 21/8234* (2006.01)

(52) U.S. Cl. .................... 438/294; 438/197; 438/296; 438/299; 438/301; 438/306; 257/E29.132; 257/E29.133; 257/E21.205

(58) Field of Classification Search ................ 257/346, 257/E29.132, E29.133, E21.205; 438/197–308
See application file for complete search history.

(56) References Cited

U.S. PATENT DOCUMENTS

| | | | | |
|---|---|---|---|---|
| 5,482,876 A | * | 1/1996 | Hsieh et al. ................ | 438/303 |
| 6,078,086 A | * | 6/2000 | Park .......................... | 257/386 |
| 6,136,674 A | * | 10/2000 | An et al. .................... | 438/585 |
| 6,207,485 B1 | * | 3/2001 | Gardner et al. ............. | 438/216 |
| 6,472,281 B2 | * | 10/2002 | Doi et al. ................... | 438/305 |
| 6,642,581 B2 | * | 11/2003 | Matsuda et al. ............ | 257/369 |
| 6,680,504 B2 | * | 1/2004 | Howard et al. ............. | 257/300 |
| 6,709,934 B2 | * | 3/2004 | Lee et al. ................... | 438/287 |
| 2005/0142729 A1 | * | 6/2005 | Shin et al. .................. | 438/231 |

* cited by examiner

*Primary Examiner*—Kiesha R Bryant
*Assistant Examiner*—Eric Ward
(74) *Attorney, Agent, or Firm*—Sherr & Vaughn, PLLC

(57) ABSTRACT

Embodiments relate to a gate structure of a semiconductor device and a method of manufacturing the gate structure. An oxide layer may be formed on a silicon substrate before a gate insulating layer is formed. The oxide layer may be etched to form an opening exposing a channel area of the silicon substrate. After forming the gate insulating layer in the opening, a gate conductive layer may be deposited and etched to form a gate. The oxide layer may be continuously etched such that the oxide layer remains at both edge portions of the gate insulating layer. The oxide layer formed at both edge portions of the gate insulating layer may protect the gate insulating layer during a gate etching process, and may improve a reliability of the semiconductor device. Since a length of the gate insulating layer may become shorter than the length of the gate due to the protective oxide layer, the low-density source/drain junction may not overlap a lower portion of the gate insulating layer, which may improve a performance of the semiconductor device.

5 Claims, 4 Drawing Sheets

GATE STRUCTURE OF A SEMICONDUCTOR DEVICE

The present application claims priority under 35 U.S.C. 119 and 35 U.S.C. 365 to Korean Patent Application No. 10-2005-0134167 (filed on Dec. 29, 2005), which is hereby incorporated by reference in its entirety.

BACKGROUND

Related art semiconductor manufacturing technologies may cause plasma damage to an edge portion of a gate insulating layer during an etching process for forming a gate. Such plasma damage may lead to a hot carrier effect, and may degrade characteristics of the gate insulating layer and lower reliability of semiconductor devices. In addition, a junction formed through low-density ion implantation may be partially overlapped with a lower portion of the gate insulating layer due to ion diffusion into the lower portion of the gate insulating layer. Thus, gate induced drain leakage (GIDL) characteristics are degraded and parasitic capacitance may be created, so that performance of the semiconductor device may be degraded.

A related art device will be described with reference to accompanying drawings. FIGS. 1A to 1C are sectional diagrams illustrating a related art gate structure of a semiconductor device and a method of manufacturing the same.

Referring to FIG. 1A, a shallow trench isolation (STI) process and a well forming process may be performed relative to a silicon substrate. Gate insulating layer 11 and gate conductive layer 12 may be deposited and patterned on a silicon substrate 10. Plasma damage may be caused to edge portion 11a of gate insulating layer 11 due to an etching process. Reliability of any semiconductor device may thereby be lowered.

Referring to FIG. 1B, thin oxide layer 13 may be deposited on the silicon substrate 10 and an ion implantation process may be performed to form low-density source/drain junction 14. Thin oxide layer 13 may be a temporal oxide layer, which may be temporarily formed to protect a surface of the silicon substrate.

However, a deposition process and a removal process for temporal oxide layer 13 may further cause damage to gate insulating layer 11, and may degrade a reliability of the semiconductor device.

In addition, source/drain junction 14 formed through the low-density ion implantation may be partially overlapped with a lower portion of gate insulating layer 11 due to ion diffusion.

As described above, such an overlap may be a factor that degrades a performance of the semiconductor device.

Referring to FIG. 1C, temporal oxide layer 13 may be removed. A spacer insulating layer may be deposited and then gate spacer 15 may be formed by performing an anisotropic etching process. Gate spacer 15 may include oxide 15a and nitride 15b. High-density ion implantation process may be performed and may form high-density source/drain junction 16. Various other components, such as an interlayer dielectric layer, a metal interconnection, etc., may be formed through subsequent processes.

SUMMARY

Embodiments relate to a semiconductor device manufacturing technology. Embodiments relate to a gate structure that may be capable improving reliability of a semiconductor device by forming a protective oxide layer on an edge portion of a gate insulating layer and a method of manufacturing the same.

Embodiments relate to a gate structure and a method of manufacturing the same, that may be capable improving reliability of a semiconductor device and may protect an edge portion of a gate insulating layer which may be readily subject to plasma damage.

Embodiments relate to a gate structure and a method of manufacturing the same, that may be capable improving performance of a semiconductor device by preventing a source/drain junction from partially overlapping with a lower portion of a gate channel.

In embodiments, a gate structure and a method of manufacturing same may include a gate insulating layer formed on a channel area of a silicon substrate, a protective oxide layer formed at both edge portions of the gate insulating layer, and a gate formed on the gate insulating layer and the protective oxide layer.

In embodiments, a length of the gate insulating layer may be shorter than a length of a gate. In embodiments, a length of the gate insulating layer may be shorter than a length of a gate by 100 Å to 1000 Å.

In embodiments, a thickness of the protective oxide layer may be larger than a thickness of the gate oxide layer and smaller than a thickness of the gate. In embodiments, a thickness of the protective oxide layer may be in a range of 50 Å to 500 Å.

In embodiments, a method may include (a) forming an oxide layer on a silicon substrate, (b) etching the oxide layer such that a channel area of the silicon substrate is exposed, thereby forming an opening, (c) forming a gate insulating layer on the silicon substrate exposed through the opening, (d) depositing a gate conductive layer such that the opening is sufficiently filled with the gate conductive layer, and (e) forming a gate by etching the gate conductive layer and forming a protective oxide layer at both edge portions of the gate insulating layer by etching the oxide layer.

In embodiments, a chemical vapor deposition process or a thermal oxidation process may be performed in step (a), and a mask used in step (e) may be employed in step (b).

In embodiments, in step (b), the opening may be formed such that a length of the opening may be shorter than a length of the gate. For instance, the length of the opening may be shorter than the length of the gate by 100 Å to 1000 Å.

DETAILED DESCRIPTION OF EMBODIMENTS

Figure 1A:
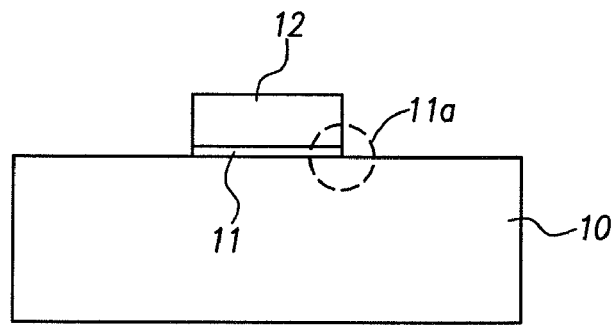
FIGS. 1A to 1C are example sectional diagrams illustrating a gate structure of a semiconductor device and a method of manufacturing the same according to the related art.
Figure 1B:
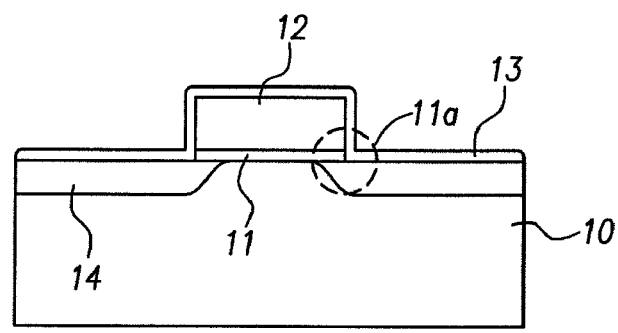
Figure 1C:
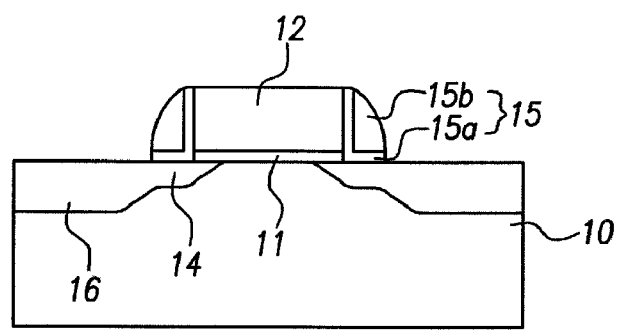
Figure 2A:
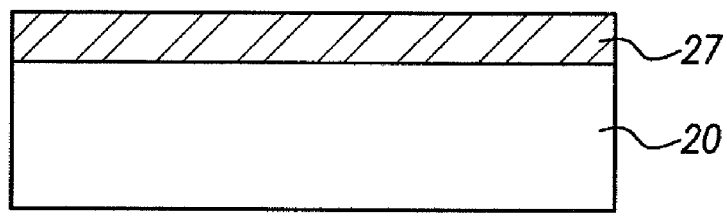
FIGS. 2A to 2F are example sectional diagrams illustrating a gate structure of a semiconductor device and a method of manufacturing the same according to embodiments.

Referring to FIG. 2A, oxide layer 27 may be deposited on silicon substrate 20 that has undergone an STI process and a well forming process. Oxide layer 27 may be formed through a chemical vapor deposition (CVD) process or a thermal oxidation process. In embodiments, a thickness of oxide layer 27 may be larger than that of a gate insulating layer, which may be formed later. In embodiments, oxide layer 27 may have a thickness of approximately 50 Å to 500 Å. However, such a thickness may vary depending on characteristics of the semiconductor device.

Figure 2B:
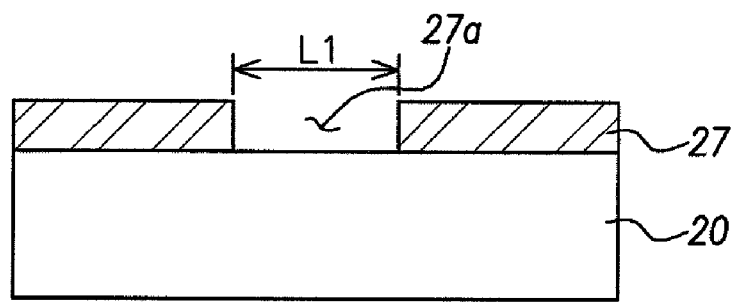

Referring to FIG. 2B, a lithography process may be performed relative to oxide layer 27. As a result, opening 27a may be formed in oxide layer 27. Opening 27a may expose a gate channel area. The lithography process may use a mask substantially identical to a gate mask used to form opening 27a in oxide layer 27. Length L1 of opening 27a may be shorter than a length of a gate, which may be formed through a subsequent processes, by approximately 100 Å to 1000 Å. This difference may be realized by adjusting the exposure dose and focus even though the same mask is used for opening 27a and the gate. In embodiments, a size of opening 27a and the gate may vary depending on the characteristics of the semiconductor device.

Figure 2C:
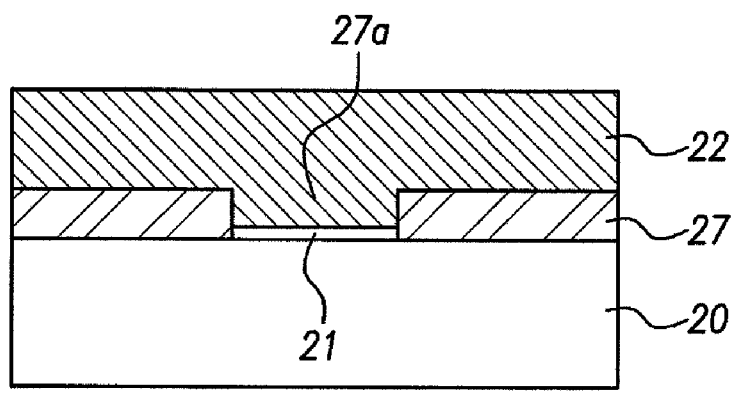

Referring to FIG. 2C, gate insulating layer 21 may be formed on silicon substrate 20, and may be exposed through opening 27a. Accordingly, a length of gate insulating layer 21 may be identical to a length of opening 27a. Gate conductive layer 22 may be deposited on the surface of the silicon substrate 20 such that opening 27a may be filled with gate conductive layer 22. A lithography process may thereafter be performed, for example using a gate mask, and may thereby pattern gate conductive layer 22 and oxide layer 27.

Figure 2D:
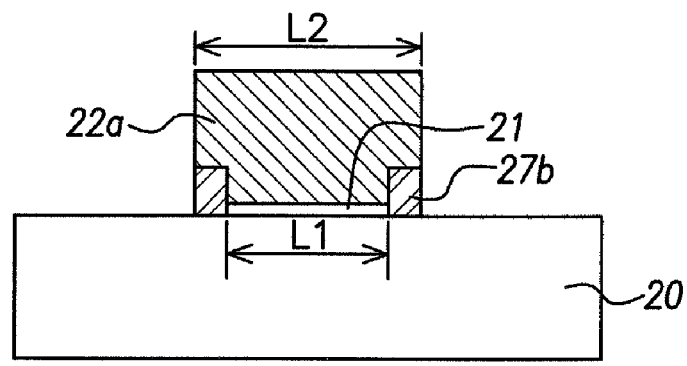

Referring to FIG. 2D, a gate may be formed and patterned oxide layer 27b may remain on edge portions of gate 22a. Oxide layer 27b may be a protective oxide layer that may protect the edge portions of gate insulating layer 21. A thickness of protective oxide layer 27b may be smaller than that of gate 22a and larger than that of gate insulating layer 21. In embodiments, length L1 of gate insulating layer 21 may become shorter than length L2 of gate 22a due to protective oxide layer 27b that may be formed on an edge portion of gate insulating layer 21.

In embodiments, since protective oxide layer 27b may be formed at both edge portions of the gate insulating layer, plasma damage may be prevented and a reliability of the semiconductor device may be improved.

Figure 2E:
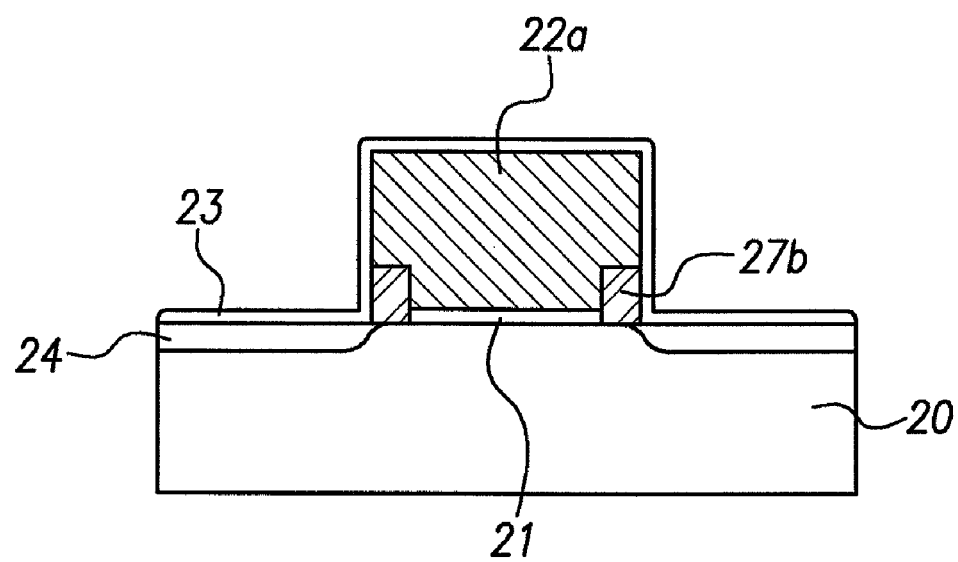

Referring to FIG. 2E, thin temporal oxide layer 23 may be deposited and may protect silicon substrate 20. A low-density ion implantation process may be performed to form a low-density source/drain area 24. In embodiments, since the length of gate insulating layer 21 may be shorter than the length of gate 22a, the low-density source/drain area 24 may not overlap with gate insulating layer 21 even if ion diffusion occurs due to the low-density ion implantation. In addition, gate insulating layer 21 may be prevented from being damaged when temporal oxide layer 23 may be deposited and removed.

After removing temporal oxide layer 23, a spacer insulating layer may be deposited and an anisotropic etching process may be performed.

Figure 2F:
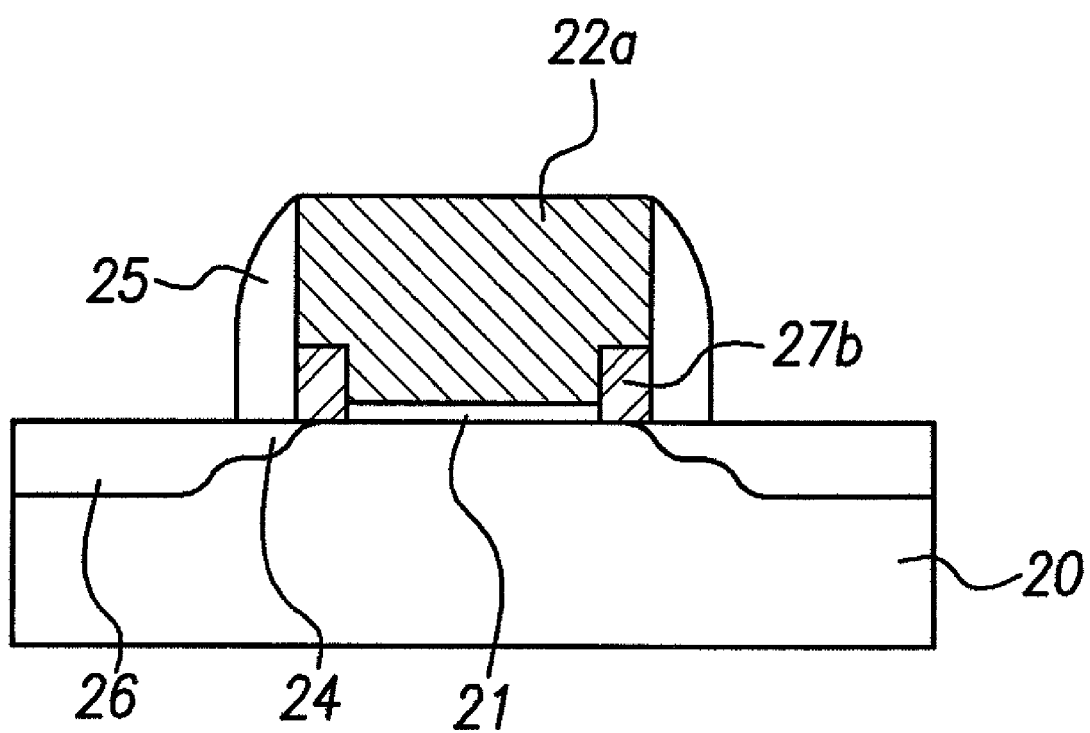

Referring to FIG. 2F, gate spacers 25 may thus be formed at both sidewalls of gate 22a. In addition, a high-density ion implantation process may be performed by using gate spacer 25 as an ion implantation mask, and may thereby form high-density source/drain 26.

After that, although not shown in the figures, an interlayer dielectric layer, a metal interconnection, etc. may be formed through subsequent processes.

As described above, according to embodiments, a protective oxide layer may be formed at both edge portions of the gate insulating layer so that the gate insulating layer is not exposed during the gate etching process so that the plasma damage may be prevented.

Accordingly, certain characteristics of the gate insulating layer may be prevented from being degraded and a reliability of the semiconductor device may be improved. In addition, the gate insulating layer may be prevented from being damaged when the temporal oxide layer, which may be used for low-density ion implantation, may be deposited or removed.

Furthermore, according to embodiments, the low-density source/drain junction may be prevented from diffusing into a lower portion of the gate insulating layer, so that the low-density source/drain junction may not overlap with the lower part of the gate insulating layer. Thus, gate induced drain leakage and parasitic capacitance may be prevented, improving the performance of the semiconductor device.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a first oxide layer over a silicon substrate;
   etching the first oxide layer to form first oxide layer patterns such that a portion of the silicon substrate at a channel area thereof is exposed, thereby forming an opening;
   forming a gate insulating layer over the portion of the silicon substrate exposed through the opening;
   depositing a gate conductive layer on and directly contacting the gate insulating layer such that the opening is filled with the gate conductive layer;
   forming a gate and protective first oxide layer patterns at lower sidewalls of the gate by etching the gate conductive layer and the first oxide layer patterns, wherein the protective first oxide layer patterns directly contact edge portions of the gate insulating layer, the uppermost surface of the silicon substrate and lower edge portions of the gate;
   forming a second oxide layer on the silicon substrate including the uppermost surface of the gate and sidewalls of the gate and the protective first oxide layer patterns;
   forming low-density source/drains in the silicon substrate by performing a low-density ion implantation process after forming the second oxide layer;
   removing the second oxide layer from the uppermost surface and sidewalls of the gate and sidewalls of the first oxide layer patterns after forming the low-density source/drains;
   forming gate spacers on and directly contacting sidewalls of the gate and the protective first oxide layer patterns after removing the second oxide layer and forming the low-density source/drains, wherein the gate spacers overlap the low-density source/drain areas; and then
   forming high-density source/drains by performing a high-density ion implantation process using the gate spacers as an ion implantation mask, wherein the gate insulating layer does not overlap the low-density source/drain and the high-density source/drains.

2. The method of claim 1, wherein one of a chemical vapor deposition process and a thermal oxidation process is performed to form the first oxide layer.

3. The method of claim 1, wherein a mask used to etch the first oxide layer is used to form the opening.

4. The method of claim 1, wherein the opening is formed such that a length of the opening is less than a length of the gate.

5. The method of claim 1, wherein a length of the opening is less than a length of the gate by 100 Å to 1000 Å.

* * * * *